US012588556B2

(12) United States Patent
Wang

(10) Patent No.: US 12,588,556 B2
(45) Date of Patent: Mar. 24, 2026

(54) DISPLAY APPARATUS

(71) Applicant: AUO Corporation, Hsinchu (TW)

(72) Inventor: Chih-Kai Wang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 686 days.

(21) Appl. No.: 17/945,098

(22) Filed: Sep. 15, 2022

(65) Prior Publication Data

US 2023/0307425 A1 Sep. 28, 2023

(30) Foreign Application Priority Data

Mar. 23, 2022 (TW) .................................. 111110819

(51) Int. Cl.
*H01L 25/075* (2006.01)
*H10H 20/857* (2025.01)

(52) U.S. Cl.
CPC ....... *H01L 25/0753* (2013.01); *H10H 20/857* (2025.01)

(58) Field of Classification Search
CPC .............. H01L 25/0753; H01L 25/167; H10H 20/8506; H10H 20/85; H10H 20/852; H10H 29/142; H10H 20/857
See application file for complete search history.

(56) References Cited

U.S. PATENT DOCUMENTS 9,818,803 B2 11/2017 Lee
10,274,654 B2 4/2019 Jin et al.

| | | | |
|---|---|---|---|
| 10,854,683 B2 | 12/2020 | Lee | |
| 2013/0234917 A1 | 9/2013 | Lee | |
| 2018/0069057 A1 | 3/2018 | Lee | |
| 2018/0088260 A1* | 3/2018 | Jin | ......................... G02F 1/1362 |
| 2019/0058016 A1* | 2/2019 | Chung | ................. H10K 59/352 |
| 2019/0333970 A1 | 10/2019 | Lee | |
| 2022/0157897 A1 | 5/2022 | Dou et al. | |
| 2024/0030271 A1* | 1/2024 | Yu | ......................... H10K 59/353 |

FOREIGN PATENT DOCUMENTS

| | | |
|---|---|---|
| CN | 103311266 | 10/2015 |
| CN | 106856075 | 6/2017 |
| CN | 108701708 | 10/2018 |
| CN | 110993665 | 4/2020 |
| CN | 210777624 | 6/2020 |

* cited by examiner

*Primary Examiner* — Victor A Mandala
(74) *Attorney, Agent, or Firm* — JCIPRNET

(57) ABSTRACT

A display apparatus including a carrier and a plurality of pixel units is disclosed. Each pixel unit has a first light-emitting device. The pixel units are provided with a plurality of second light-emitting devices and a plurality of third light-emitting devices, and include a first pixel unit, a second pixel unit, a third pixel unit, and a fourth pixel unit sequentially arranged along a first direction. The first pixel unit and the second pixel unit adjacent to each other share one second light-emitting device and one third light-emitting device. The third pixel unit and the fourth pixel unit adjacent to each other share another second light-emitting device and another third light-emitting device. The second light-emitting devices and the third light-emitting devices are not disposed between two first light-emitting devices of the second pixel unit and third pixel unit adjacent to each other.

19 Claims, 13 Drawing Sheets

DISPLAY APPARATUS

CROSS-REFERENCE TO RELATED APPLICATION

This application claims the priority benefit of Taiwanese application no. 111110819, filed on Mar. 23, 2022. The entirety of the above-mentioned patent application is hereby incorporated by reference herein and made a part of this specification.

BACKGROUND

Technical Field

The disclosure relates to a display apparatus, and in particular to a self-luminous display apparatus.

Description of Related Art

Light-emitting diode (LED) panels are expected to become mainstream display panels in the next generation for power saving, high efficiency, high brightness, and fast response times. Currently, relatively common packaging of the LED panel is by directly bonding an LED element on a bonding pad of a circuit board (chip on board, COB), and utilizing epoxy resin for encapsulation. However, such packaging tends to require the design of new circuit boards to meet the design requirements of different pixel arrangements, which is likely to extend the product development schedule, and has relatively high labor cost. On the other hand, with the rise of environmental awareness, energy saving has become one of the important indicators to measure the performance of display panels. Therefore, how to reduce the number of light-emitting devices used and maintain the display quality is also an issue in the development of such display panels.

SUMMARY

The disclosure provides a display apparatus with a relatively high display resolution and relatively high commonality of circuit design.

According to an embodiment of the disclosure, a display apparatus includes a carrier and a plurality of pixel units disposed on the carrier. Each of the pixel units has a first light-emitting device. The pixel units are provided with a plurality of second light-emitting devices and a plurality of third light-emitting devices. The pixel units include a first pixel unit, a second pixel unit, a third pixel unit, and a fourth pixel unit sequentially arranged along a first direction. The first pixel unit and the second pixel unit being adjacent to each other share one of the second light-emitting devices and one of the third light-emitting devices. The third pixel unit and the fourth pixel unit being adjacent to each other share another one of the second light-emitting devices and another one of the third light-emitting devices. The second light-emitting devices and the third light-emitting devices are not disposed between the two first light-emitting devices of the second pixel unit and the third pixel unit being adjacent to each other.

Based on the foregoing, in the display apparatus according to the embodiments of the disclosure, in the four pixel units arranged successively, the first pixel unit and the second pixel unit share one second light-emitting device and one third light-emitting device, the third pixel unit and the fourth pixel unit share another one second light-emitting device and another one third light-emitting device, and the second light-emitting devices and the third light-emitting devices are not disposed between the second pixel unit and the third pixel unit. Accordingly, the number of light-emitting devices used can be reduced, and the arrangement distance between pixel units can also be reduced, which helps to improve the display quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
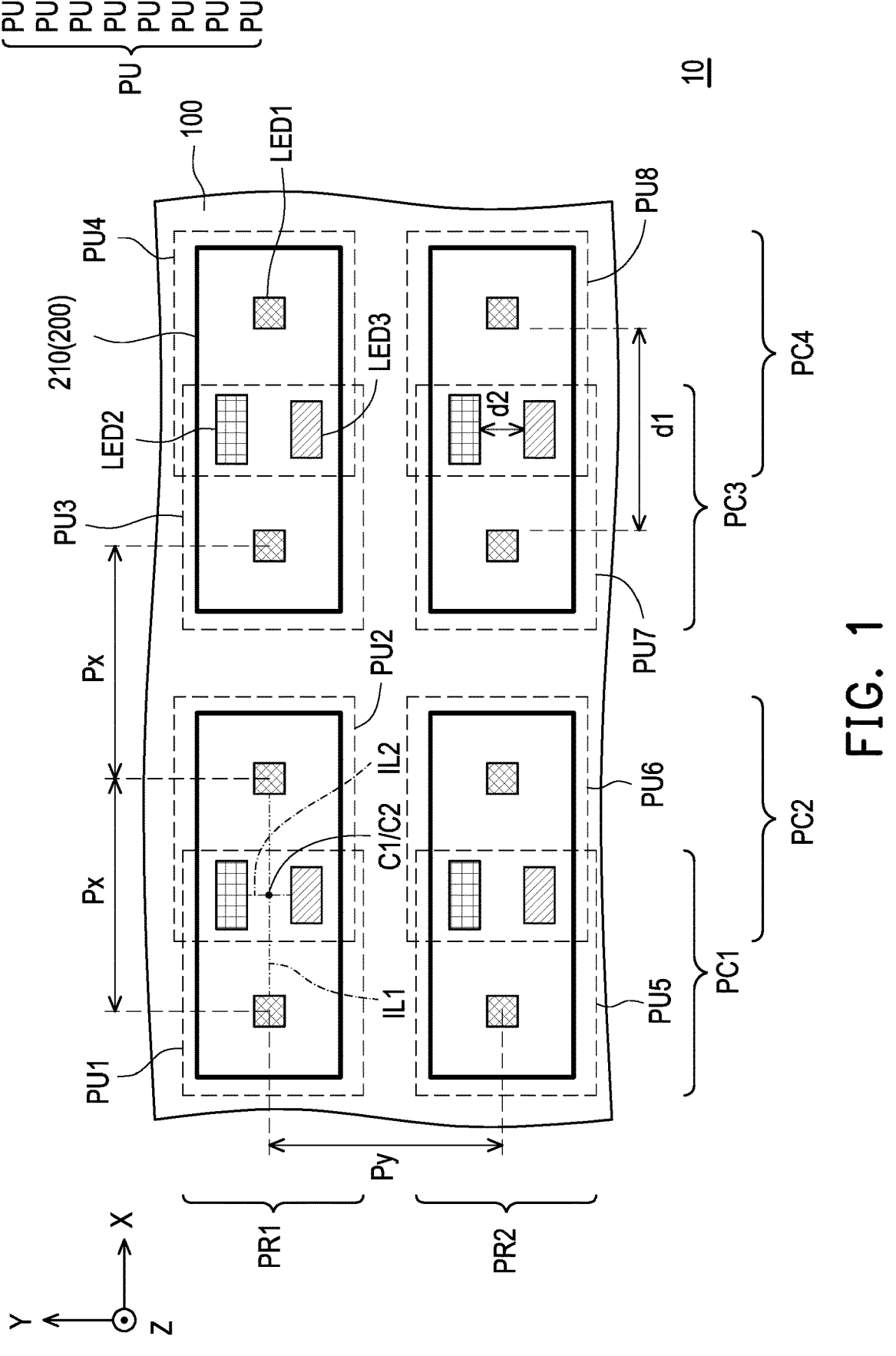
FIG. 1 is a schematic top view of a display apparatus according to a first embodiment of the disclosure.

The term "about", "approximately", "essentially", or "substantially" as used herein is inclusive of a stated value and means within an acceptable range of deviation for a particular value as determined by people having ordinary skill in the art, considering the measurement in question and the particular quantity of errors associated with measurement (i.e., the limitations of the measurement system). For instance, "about" may mean within one or more standard deviations or within ±30%, ±20%, ±15%, ±10%, or ±5% of the stated value. Furthermore, a relatively acceptable range of deviation or standard deviation may be selected for the term "about", "approximately", "essentially", or "substantially" as used herein based on measurement properties, cutting properties, or other properties, instead of applying one standard deviation across all properties.

In the drawings, thicknesses of layers, films, panels, regions, etc., are exaggerated for the sake of clarity. It should be understood that when an element such as a layer, film, region, or substrate is referred to as being "on", or "connected to" another element, it may be directly on or connected to another element, or intermediate elements may also be present. In contrast, when an element is referred to as being "directly on" or "directly connected to" another element, no intermediate elements are present. As used herein, the term "connection" may refer to physical and/or electrical connection. Furthermore, "electrical connection" may encompass the presence of other elements between two elements.

Moreover, relative terms such as "lower" or "bottom" and "upper" or "top" may herein serve for describing the relation between one element and another element as shown in the drawings. It should also be understood that the relative terms are intended to include different directions of a device in addition to the direction as shown in the drawings. For instance, if a device in the drawings is turned upside down, an element described as being on the "lower" side of other elements shall be re-orientated to be on the "upper" side of the other elements. Thus, the exemplary term "lower" may include the orientations of "lower" and "upper", depending on the specific orientation of the drawings. Similarly, if a device in the drawings is turned upside down, an element described to be "below" or "beneath" other elements shall be re-orientated to be "above" the other elements. Therefore, the exemplary term "below" or "beneath" may include the orientations of above and below.

Exemplary embodiments are described herein with reference to schematic cross-sectional views illustrating idealized embodiments. Hence, variations of shapes resulting from manufacturing technologies and/or tolerances, for instance, are to be expected. Accordingly, the embodiments described herein should not be construed as being limited to the particular shapes of regions as shown herein but include deviations in shapes that result, for instance, from manufacturing. For instance, regions shown or described as being flat may typically have rough and/or non-linear features. Besides, an acute angle as shown may be round. Therefore, the regions shown in the drawings are schematic in nature, and their shapes are not intended to show the exact shapes of the regions, and are not intended to limit the scope of the claims.

Reference will now be made in detail to exemplary embodiments of the disclosure, examples of which are illustrated in the accompanying drawings. Wherever possible, the same reference numerals are used in the drawings and the description to refer to the same or similar parts.

Figure 2:
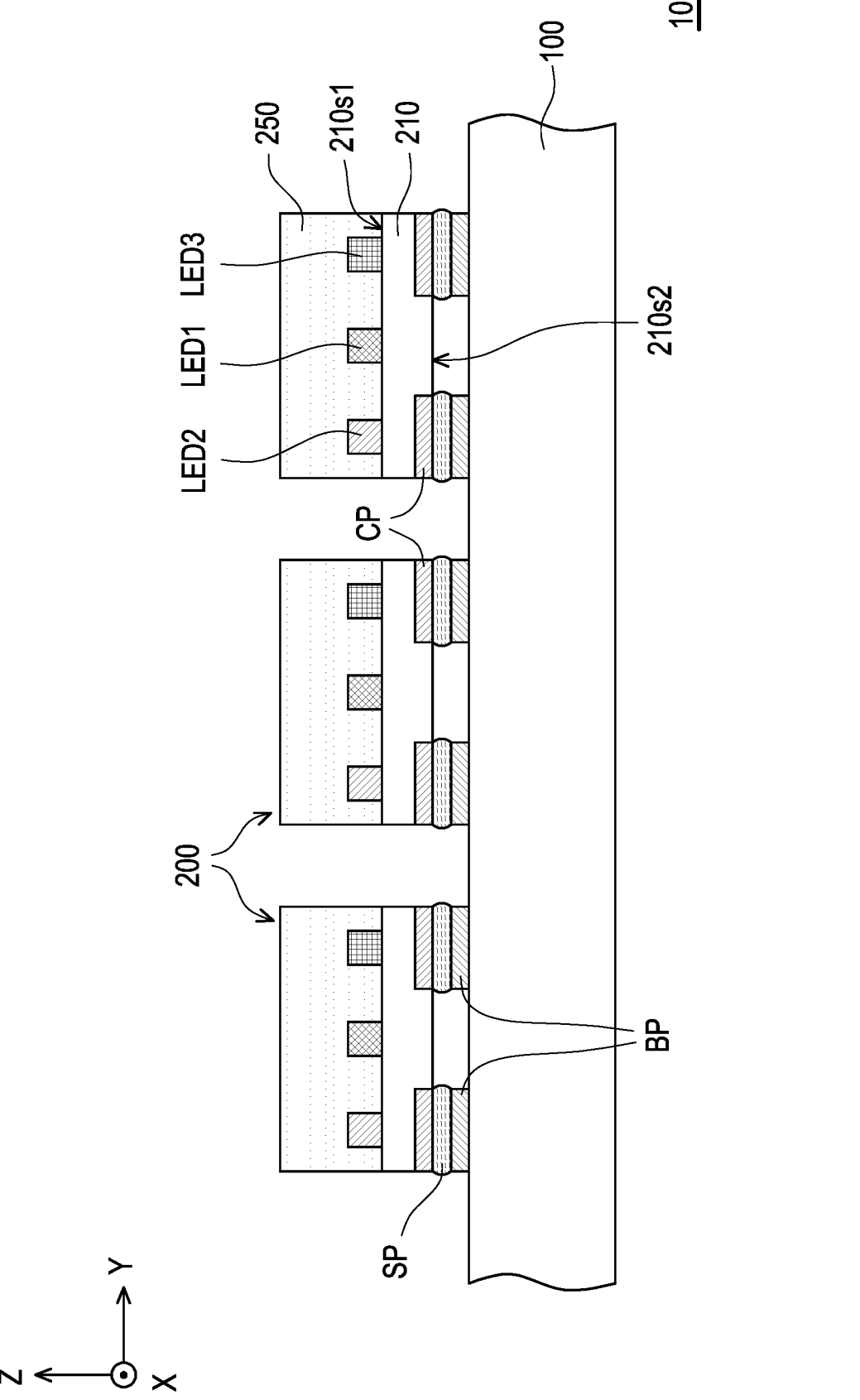
FIG. 2 is a schematic side view of the display apparatus of FIG. 1.
Figure 3:
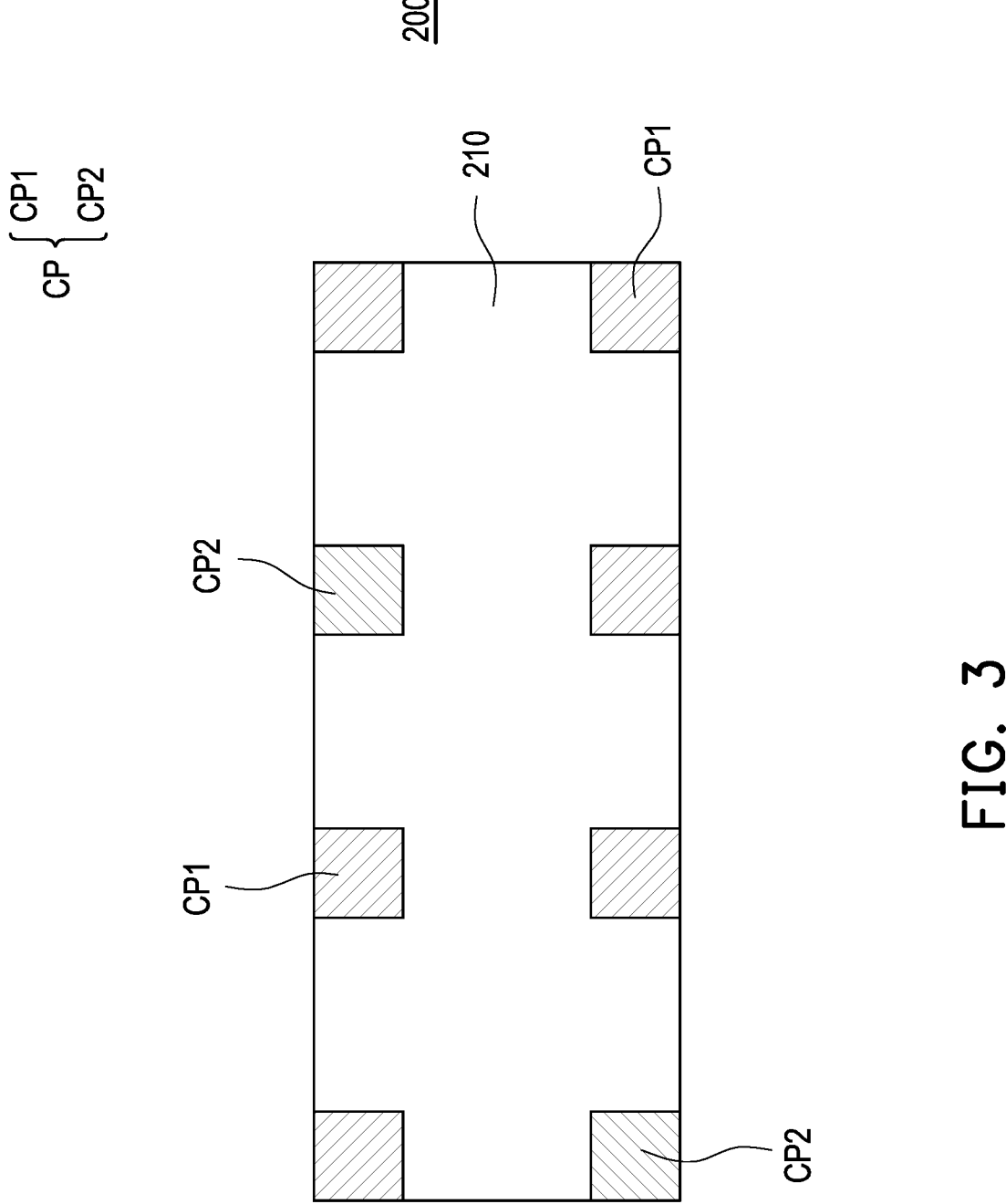
FIG. 3 is a schematic bottom view of a package structure of FIG. 1.
Figure 4:
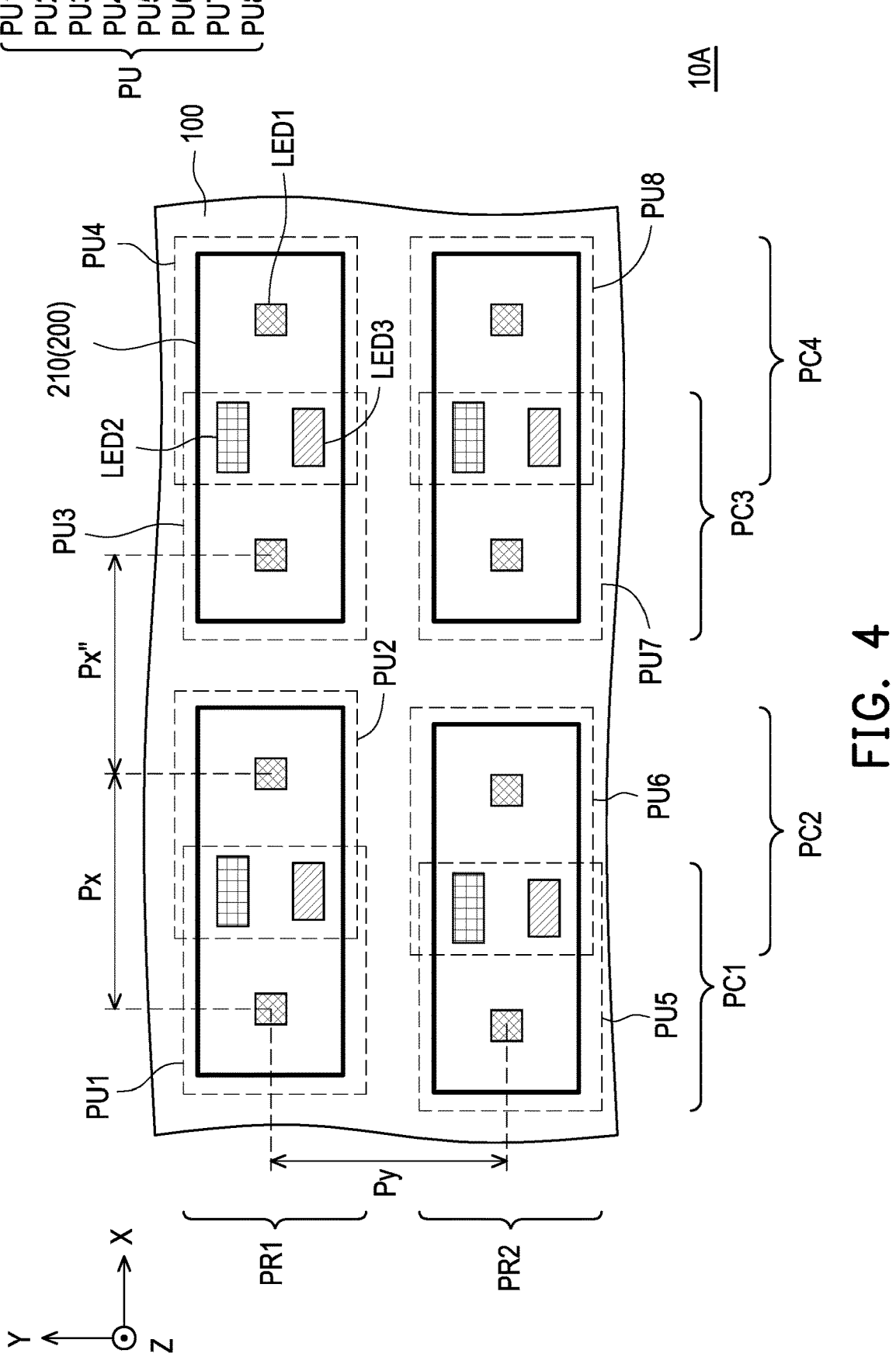
FIG. 4 is a schematic top view of a modified embodiment of the display apparatus of FIG. 1.

FIG. 1 is a schematic top view of a display apparatus according to a first embodiment of the disclosure. FIG. 2 is a schematic side view of the display apparatus of FIG. 1. FIG. 3 is a schematic bottom view of a package structure of FIG. 1. FIG. 4 is a schematic top view of a modified embodiment of the display apparatus of FIG. 1. With reference to FIG. 1, a display apparatus 10 includes a carrier 100 and a plurality of pixel units PU disposed on the carrier 100. In this embodiment, the pixel units PU may be respectively arranged along the direction X and the direction Y into multiple columns and multiple rows. More specifically, the pixel units PU may be arranged into an array on the carrier 100.

For example, a pixel unit PU1, a pixel unit PU2, a pixel unit PU3, and a pixel unit PU4 are sequentially arranged along the direction X into a pixel row PR1; and a pixel unit PU5, a pixel unit PU6, a pixel unit PU7, and a pixel unit PU8 are sequentially arranged along the direction X into another pixel row PR2. The pixel unit PU1 and the pixel unit PU5 are arranged along the direction Y into a pixel column PC1, the pixel unit PU2 and the pixel unit PU6 are arranged along the direction Y into a pixel column PC2, the pixel unit PU3 and the pixel unit PU7 are arranged along the direction Y into a pixel column PC3, and the pixel unit PU4 and the pixel unit PU8 are arranged along the direction Y into a pixel column PC4. For exemplary description, eight pixel units are taken as an example for the number of pixel units PU shown in FIG. 1, and the pixel units are respectively arranged along the direction X and the direction Y into two pixel rows and four pixel columns. Nonetheless, the disclosure is limited thereto.

The pixel units PU may be provided with a plurality of light-emitting devices LED1, a plurality of light-emitting devices LED2, and a plurality of light-emitting devices LED3. For example, in this embodiment, a color of light emitted by the light-emitting device LED1 is green, a color of light emitted by the light-emitting device LED2 is one of blue and red, and a color of light emitted by the light-emitting device LED3 is the other one of blue and red. For example, in this embodiment, an orthogonal projection area of the light-emitting device LED1 on the carrier 100 may be less than an orthogonal projection area of the light-emitting device LED2 on the carrier 100 or an orthogonal projection area of the light-emitting device LED3 on the carrier 100, but not limited thereto. In this embodiment, the light-emitting device LED1, the light-emitting device LED2, and the light-emitting device LED3 may be a flip-chip type light-emitting device, a vertical type light-emitting device, or a lateral type light-emitting device. For example, in some embodiments, one of the light-emitting device LED1, the light-emitting device LED2, and the light-emitting device LED3 may be one of the flip-chip type light-emitting device, the vertical type light-emitting device, and the lateral type light-emitting device, and another one of the light-emitting device LED1, the light-emitting device LED2, and the light-emitting device LED3 may be another one of the flip-chip type light-emitting device, the vertical type light-emitting device, and the lateral type light-emitting device.

Areas occupied by some adjacent two of the pixel units arranged along the direction X may overlap each other. For example, in the frontal direction of the display apparatus 10 (e.g., the direction Z), the area occupied by the pixel unit PU1 partially overlaps the area occupied by the pixel unit PU2, and the area occupied by the pixel unit PU3 partially overlaps the area occupied by the pixel unit PU4, but the areas respectively occupied by the pixel unit PU2 and the pixel unit PU3 adjacent to each other do not overlap each other. Similarly, the area occupied by the pixel unit PU5 partially overlaps the area occupied by the pixel unit PU6, and the area occupied by the pixel unit PU7 partially overlaps the area occupied by the pixel unit PU8, but the areas respectively occupied by the pixel unit PU6 and the pixel unit PU7 adjacent to each other do not overlap each other.

For example, each pixel unit PU is provided with the light-emitting device LED1. In addition, the pixel unit PU1 and the pixel unit PU2 share one light-emitting device LED2 and one light-emitting device LED3, the pixel unit PU3 and the pixel unit PU4 share one light-emitting device LED2 and one light-emitting device LED3, the pixel unit PU5 and the pixel unit PU6 share one light-emitting device LED2 and one light-emitting device LED3, and the pixel unit PU7 and the pixel unit PU8 share one light-emitting device LED2 and one light-emitting device LED3.

By sharing the light-emitting devices, the number of light-emitting devices used can be reduced, and the overall power consumption can be reduced to achieve power saving. In the meantime, the arrangement distance between the pixel units PU can also be reduced, and the resolution of the displayed image can be increased to sub-pixel resolution with correspondingly designed algorithms. Since the size of the sub-pixel is less than that of the pixel, the image resolution perceived by the human eye may be increased, thereby improving the display quality.

In this embodiment, a geometric center C1 of a virtual connecting line IL1 between two light-emitting devices LED1 of two pixel units (e.g., the pixel unit PU1 and the pixel unit PU2) sharing one light-emitting device LED2 and one light-emitting device LED3 may coincide with a geometric center C2 of a virtual connecting line IL2 between the shared light-emitting device LED2 and the shared light-emitting device LED3, and the virtual connecting line IL1 is perpendicular to the virtual connecting line IL2. More specifically, two light-emitting devices LED1 of two pixel units with overlapping occupied areas are symmetrically disposed around the virtual connecting line IL2 between the shared light-emitting device LED2 and the shared light-emitting device LED3, but the disclosure is not limited thereto.

In addition, the arrangement pitch of the pixel units PU of the display apparatus 10 may be defined by the arrangement pitch of the light-emitting devices LED1 provided to the pixel units PU. For example, in this embodiment, the light-emitting devices LED1 of the pixel units PU arranged along the direction X (e.g., the pixel unit PU1, the pixel unit PU2, the pixel unit PU3, and the pixel unit PU4) are arranged at a same pitch Px along the direction X, and the light-emitting devices LED1 of the pixel units PU arranged along the direction Y (e.g., the pixel unit PU1 and the pixel unit PU5) are arranged at a same pitch Py along the direction Y. The pitch Px and the pitch Py may be the same and may also be different.

Nonetheless, the disclosure is not limited thereto. With reference to FIG. 4, in a display apparatus 10A of another modified embodiment, a pitch Px" along the direction X between the light-emitting device LED1 of the pixel unit PU2 and the light-emitting device LED1 of the pixel unit PU3 may be different from the pitch Px along the direction X between the light-emitting device LED1 of the pixel unit PU1 and the light-emitting device LED1 of the pixel unit PU2.

With reference to FIG. 1 and FIG. 2, the display apparatus 10 may further include a plurality of circuit substrates 210 disposed between the pixel units PU and the carrier 100. The pixel units PU are disposed on surfaces 210s1 of the circuit substrates 210 facing away from the carrier 100, and are electrically connected to the carrier 100 through the circuit substrates 210. In this embodiment, two pixel units PU may be mounted on each circuit substrate 210 and may be covered with a package layer 250 to form a package structure 200. For example, the pixel unit PU1 and the pixel unit PU2 may be disposed on the same circuit substrate 210, and so on. In other words, two light-emitting devices LED1, the shared light-emitting device LED2, and the shared light-emitting device LED3 of two pixel units PU may be disposed on the circuit substrate 210 of this embodiment.

The material of the package layer 250 may include a transparent polymer or a translucent polymer, such as soft gel, an elastomer, or resin. The resin may be epoxy resin, silicone, or epoxy-silicone hybrid resin. In addition, in some embodiments, the package layer 250 may also be doped with an organic filler or an inorganic filler. The material of the filler may be selected from one among a group consisting of silicon dioxide ($SiO_2$), titanium dioxide ($TiO_2$), aluminum oxide ($Al_2O_3$), yttrium oxide ($Y_2O_3$), carbon black, sintered diamond powder, asbestos, glass, and a combination thereof.

For example, the package structure 200 may be a plastic leaded chip carrier (PLCC) package structure, a surface mounted device (SMD), a molding type package structure, or other suitable package structures. Nonetheless, the disclosure is not limited thereto. According to other embodiments not shown, the light-emitting device is directly bonded to a bonding pad of the carrier (chip on board, COB), and a packaging adhesive layer utilized for encapsulation.

On each package structure 200, the two light-emitting devices LED1 of the two pixel units PU are arranged along the direction X and have a distance d1, and the light-emitting device LED2 and the light-emitting device LED3 disposed between the two light-emitting devices LED1 and shared by the two pixel units PU are arranged along the direction Y and have a distance d2. In this embodiment, on the same package structure 200, the distance d1 between the two light-emitting devices LED1 may be greater than the distance d2 between the shared light-emitting device LED2 and the shared light-emitting device LED3, but not limited thereto.

In this embodiment, the circuit substrate 210 may be provided with a plurality of conductive pads CP on another surface 210s2 facing the carrier 100, and all light-emitting devices disposed on the other surface 210s1 may be electrically connected to at least part of the conductive pads CP through connection circuits (not shown) in the circuit substrate 210. In addition, a side surface of the carrier 100 may be provided with a plurality of bonding pads BP for bonding the package structure 200, and the conductive pads CP may be respectively bonded with the bonding pads BP on the carrier 100 through a plurality of solder patterns SP. The bonding pads BP may be electrically connected to different parts of the driving circuit (not shown) on the carrier 100 for individual electrical operations. In other words, the package structure 200 may be electrically connected to the carrier 100 through the bonding relationship between the conductive pads CP on the circuit substrate 210 and the bonding pads BP on the carrier 100.

For example, in this embodiment, all light-emitting devices of the two pixel units PU on the package structure 200 are electrically connected to only a part of the conductive pads CP1, and another part of the conductive pads CP2 are electrically insulated from the pixel units PU. In other words, the conductive pads CP2 on the circuit substrate 210 may be dummy conductive pads. Accordingly, the commonality of the carrier 100 between products with different display specification designs (e.g., different pixel arrangement designs) can be increased, which helps to reduce the product development schedule and reduce labor cost. In some embodiments, all the conductive pads CP on the package structure may also be electrically connected to all the light-emitting devices depending on different designed numbers or arrangement designs of the pixel units. In other words, in these embodiments, the dummy conductive pads CP are not disposed on the package structure.

Other embodiments will be provided below to describe the disclosure in detail, where the same members will be labeled with the same reference numerals, and the description of the same technical content will be omitted. Reference may be made to the embodiments above for the omitted part, which will not be repeatedly described below.

Figure 5:
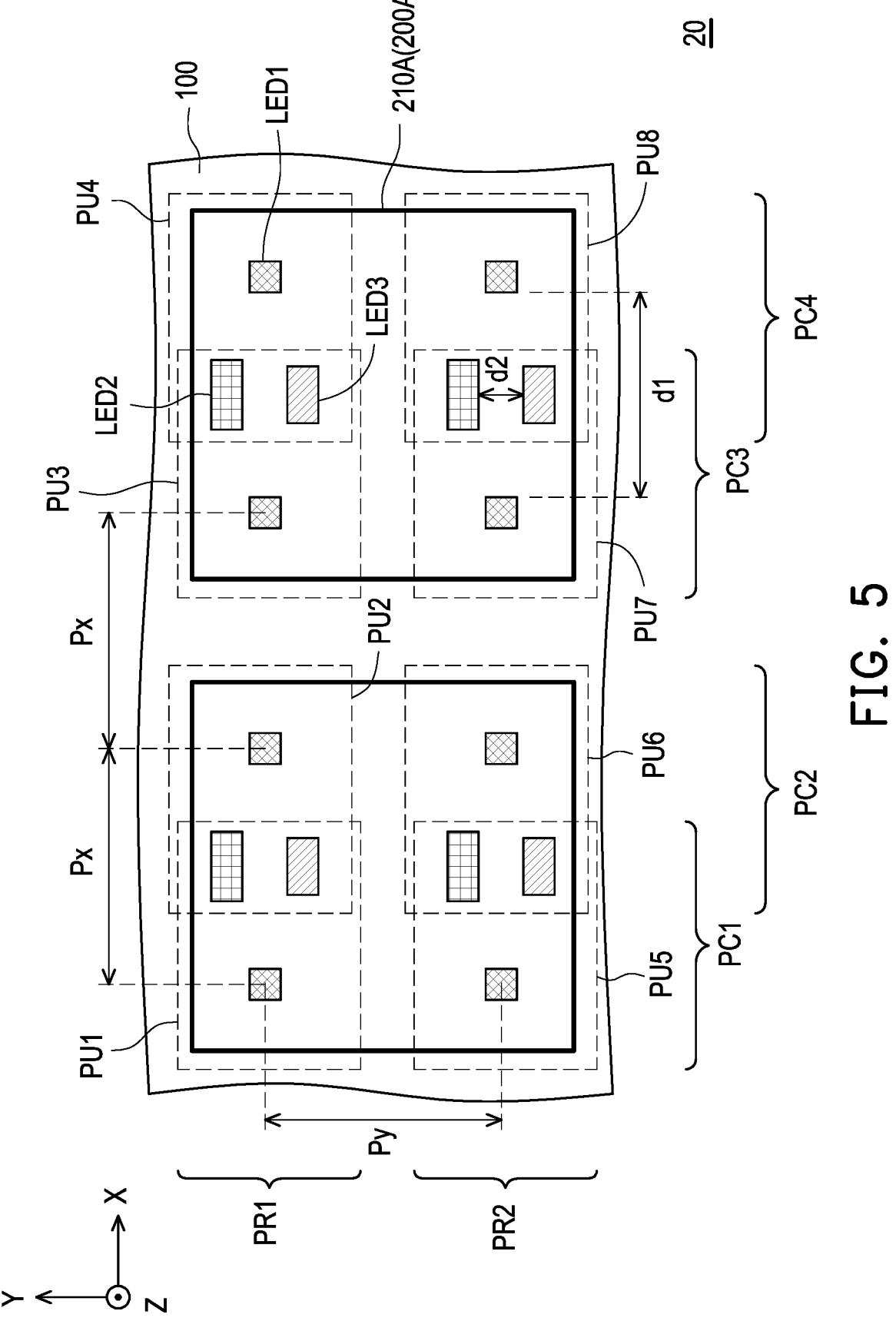
FIG. 5 is a schematic top view of a display apparatus according to a second embodiment of the disclosure.

FIG. 5 is a schematic top view of a display apparatus according to a second embodiment of the disclosure. With reference to FIG. 5, the difference between a display apparatus 20 of this embodiment and the display apparatus 10 of FIG. 1 lies in the number of pixel units disposed in one package structure.

Specifically, four pixel units may be disposed on a circuit substrate 210A of a package structure 200A of the display apparatus 20. For example, different from the pixel unit PU1 and the pixel unit PU5 being separately disposed on different circuit substrates 210 (or package structures 200) in FIG. 1, in this embodiment, the pixel unit PU1, the pixel unit PU2, the pixel unit PU5, and the pixel unit PU6 are disposed on the same circuit substrate 210 and packaged into one package structure 200A. Similarly, the pixel unit PU3, the pixel unit PU4, the pixel unit PU7, and the pixel unit PU8 are disposed on another circuit substrate 210 and packaged into another package structure 200A.

Figure 6:
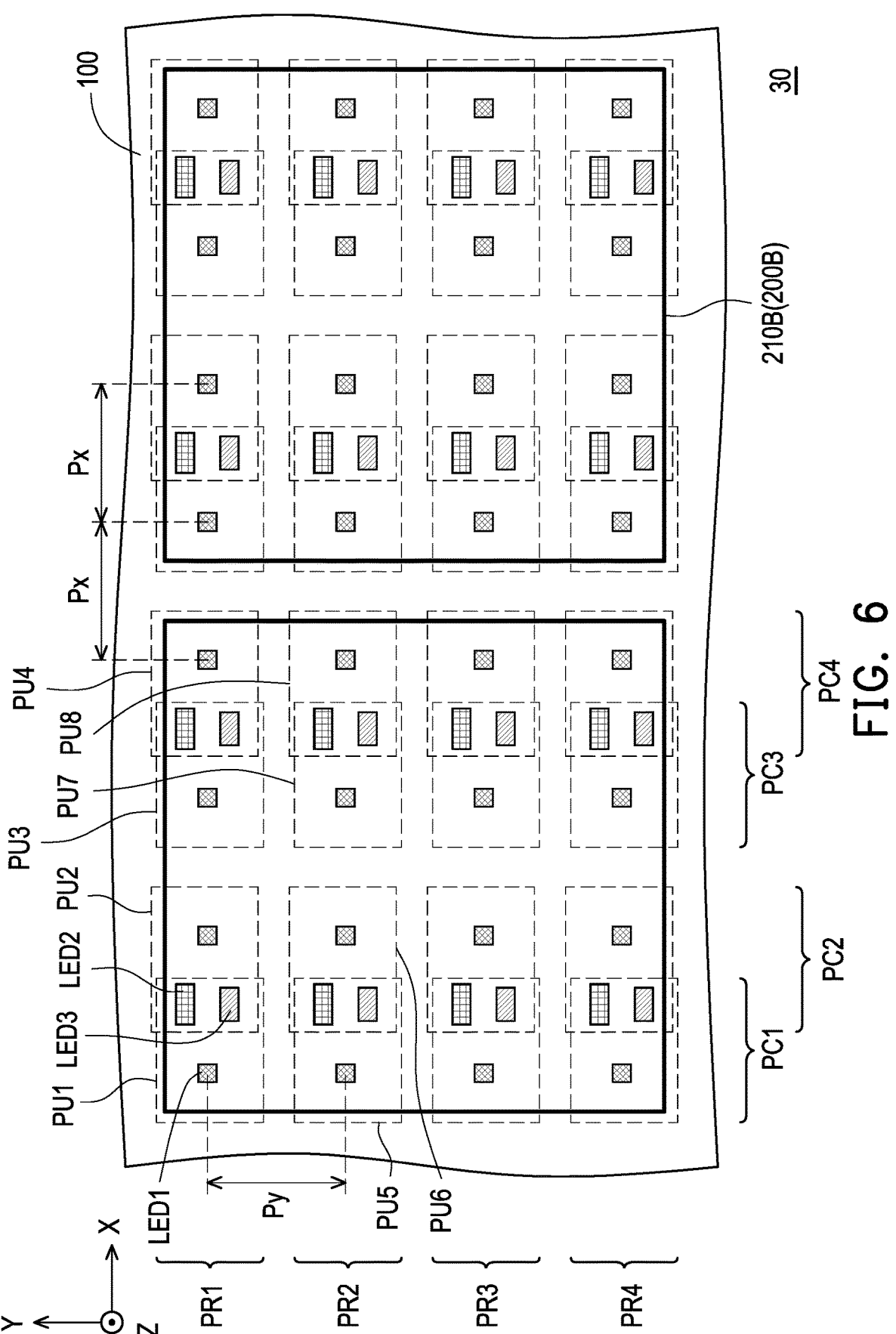
FIG. 6 is a schematic top view of a display apparatus according to a third embodiment of the disclosure.

FIG. 6 is a schematic top view of a display apparatus according to a third embodiment of the disclosure. With reference to FIG. 6, the difference between a display apparatus 30 of this embodiment and the display apparatus 10 of FIG. 1 lies in the number of pixel units disposed in one package structure. Specifically, sixteen pixel units may be disposed on a circuit substrate 210B of a package structure 200B of the display apparatus 30. For example, in this embodiment, the package structure 200B may be provided with sixteen pixel units, and the sixteen pixel units are respectively distributed in four pixel columns PC1 to PC4 and four pixel rows PR1 to PR4.

Figure 7:
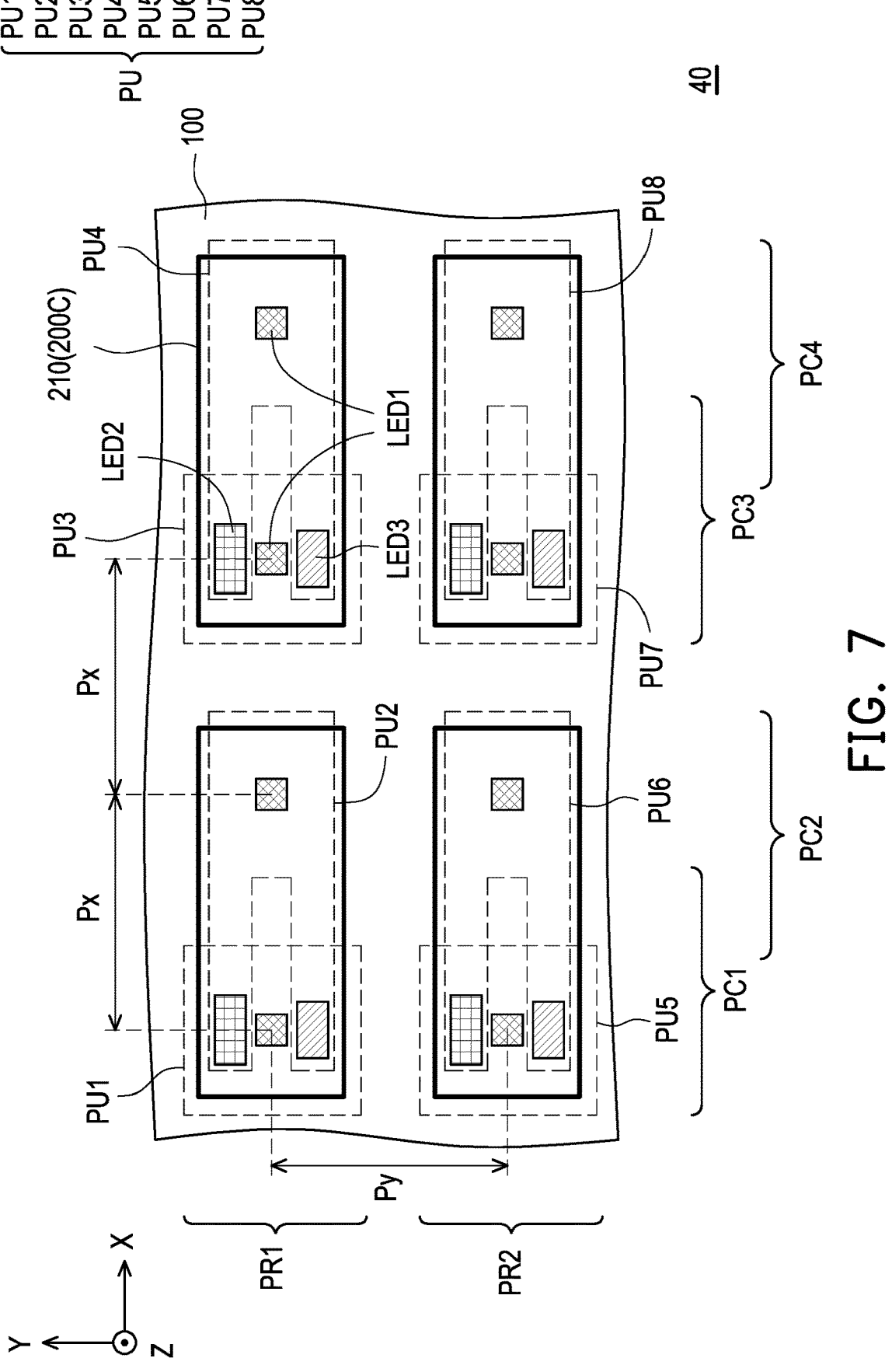
FIG. 7 is a schematic top view of a display apparatus according to a fourth embodiment of the disclosure.
Figure 8:
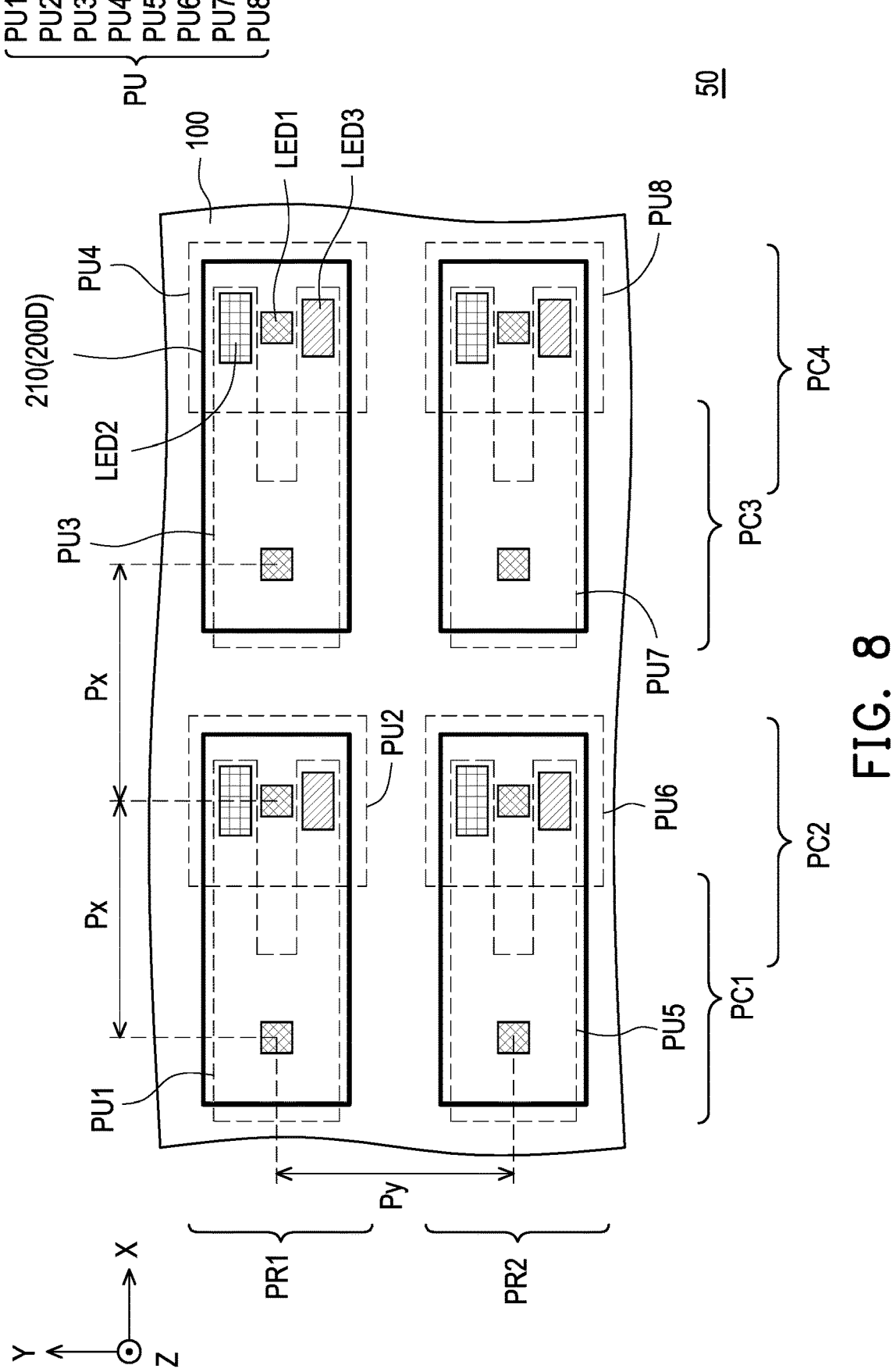
FIG. 8 is a schematic top view of a display apparatus according to a fifth embodiment of the disclosure.
Figure 9:
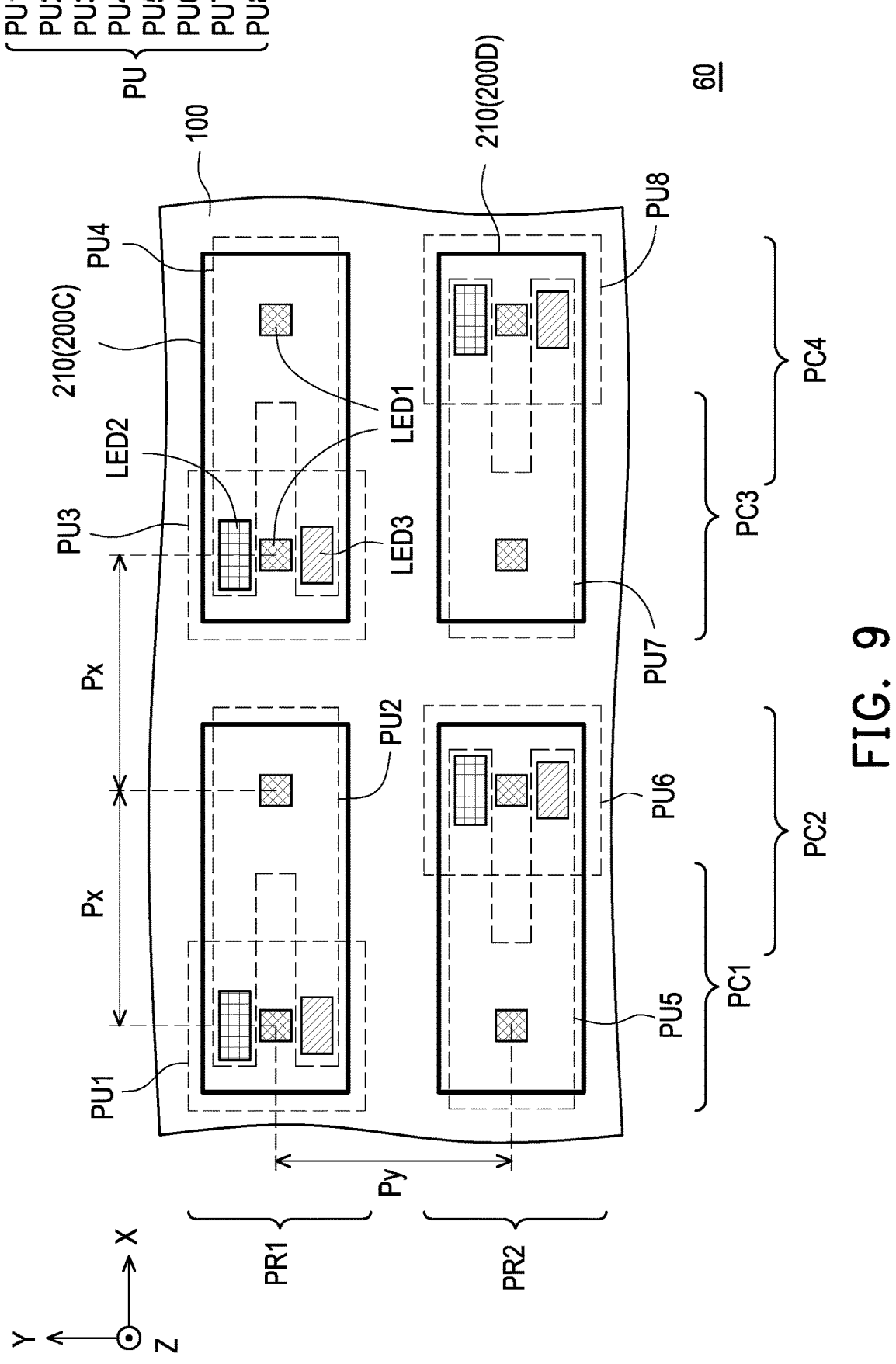
FIG. 9 is a schematic top view of a display apparatus according to a sixth embodiment of the disclosure.

FIG. 7 is a schematic top view of a display apparatus according to a fourth embodiment of the disclosure. FIG. 8 is a schematic top view of a display apparatus according to a fifth embodiment of the disclosure. FIG. 9 is a schematic top view of a display apparatus according to a sixth embodiment of the disclosure. With reference to FIG. 7, the difference between a display apparatus 40 of this embodiment and the display apparatus 10 of FIG. 1 lies in the arrangement positions of the shared light-emitting device LED2 and the shared light-emitting device LED3 on the package structure. Specifically, the light-emitting device LED2 and the light-emitting device LED3 shared by two pixel units PU on a same package structure 200C are closer to the light-emitting device LED1 of one of the pixel units PU, and farther from the light-emitting device LED1 of the other one of the pixel units PU.

For example, the light-emitting device LED2 and the light-emitting device LED3 shared by two pixel units PU on the same package structure 200C and the light-emitting device LED1 of one of the pixel units PU may be arranged along the direction Y. In this embodiment, the light-emitting device LED1 of the pixel unit PU1, the shared light-emitting device LED2, and the shared light-emitting device LED3 may be arranged along the direction Y; the light-emitting device LED1 of the pixel unit PU3, the shared light-emitting device LED2, and the shared light-emitting device LED3 may be arranged along the direction Y; and so on.

Nonetheless, the disclosure is not limited thereto. With reference to FIG. 8, in a package structure 200D of a display apparatus 50 of another embodiment, the light-emitting device LED1 of the pixel unit PU2, the shared light-emitting device LED2, and the shared light-emitting device LED3 may be arranged along the direction Y; the light-emitting device LED1 of the pixel unit PU4, the shared light-emitting device LED2, and the shared light-emitting device LED3 may be arranged along the direction Y; and so on.

With reference to FIG. 9, in a display apparatus 60 of still another embodiment, the shared light-emitting device LED2 and the shared light-emitting device LED3 on package structures distributed in different pixel rows may be arranged differently. For example, the light-emitting devices on the package structure 200C located in the pixel row PR1 (or odd-numbered rows) may be arranged as disclosed in FIG. 7, and the light-emitting devices on the package structure 200D located in the pixel row PR2 (or even-numbered rows) may be arranged as disclosed in FIG. 8.

Figure 10:
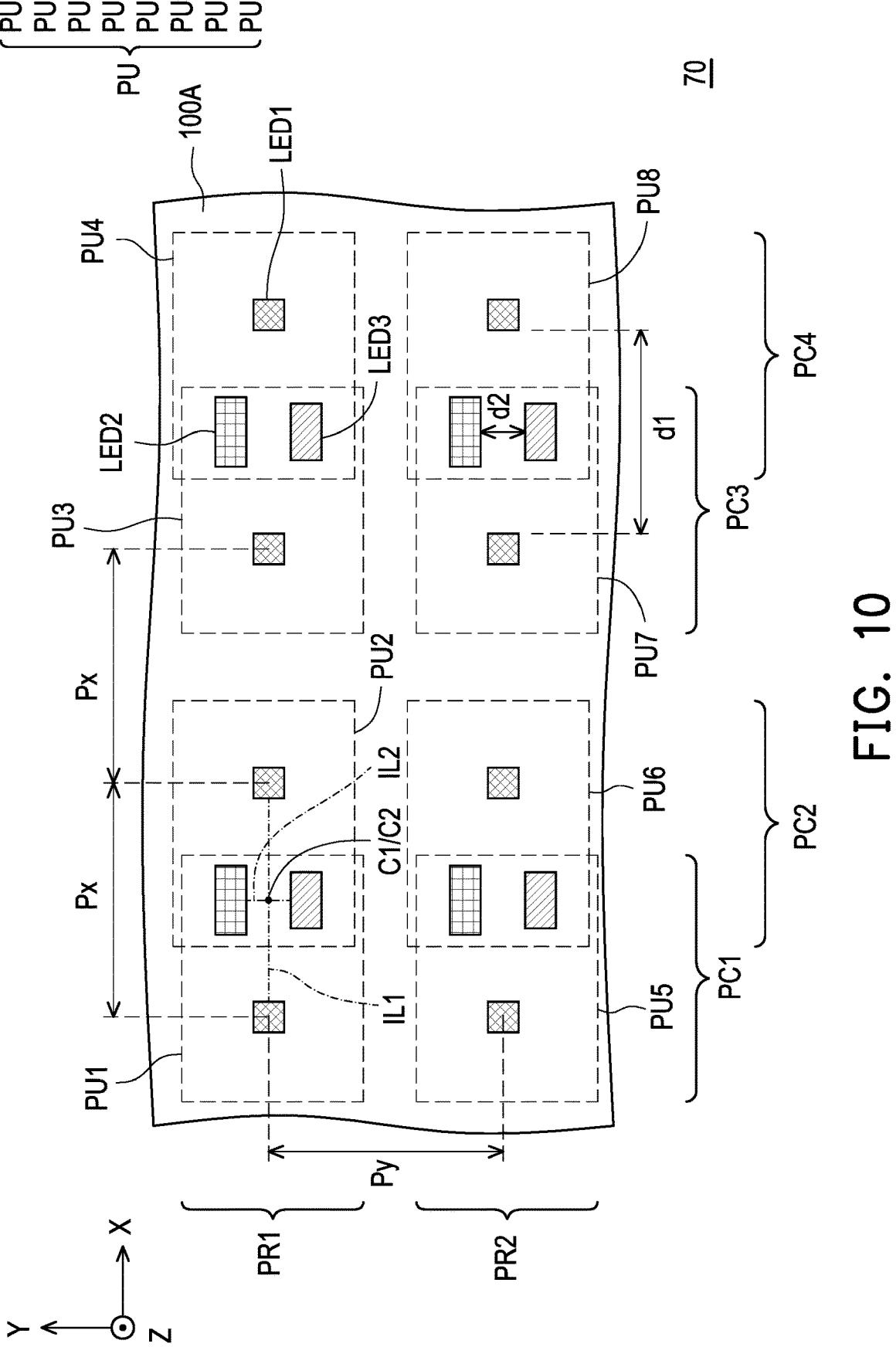
FIG. 10 is a schematic top view of a display apparatus according to a seventh embodiment of the disclosure.
Figure 11:
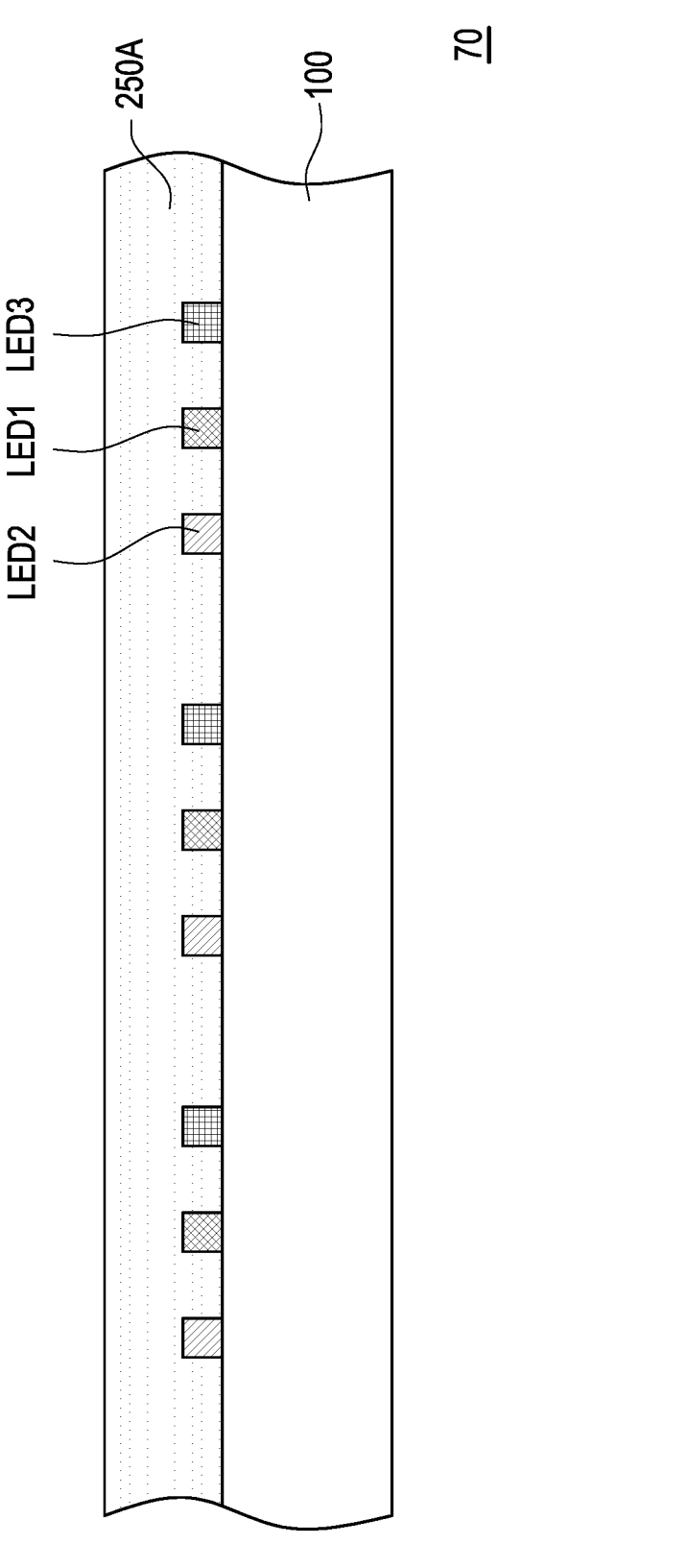
FIG. 11 is a schematic side view of the display apparatus of FIG. 10.

FIG. 10 is a schematic top view of a display apparatus according to a seventh embodiment of the disclosure. FIG. 11 is a schematic side view of the display apparatus of FIG. 10. With reference to FIG. 10 and FIG. 11, different from the display apparatus 10 of FIG. 1, in this embodiment, light-emitting devices of a display apparatus 70 are directly bonded to a carrier 100A. In other words, the display apparatus 70 is not provided with the circuit substrate 210 shown in FIG. 1 and FIG. 2, and bonding pads (not shown) for bonding the light-emitting devices may be disposed on the carrier 100A. In this embodiment, the light-emitting devices may be covered with a package layer 250A after being bonded to the carrier 100A.

Since the configuration relationship and composition of other members of the display apparatus 70 are similar to those of the display apparatus 10 of FIG. 1, reference may be made to the relevant paragraphs of the embodiments above for the detailed description, which will not be repeated here.

Figure 12:
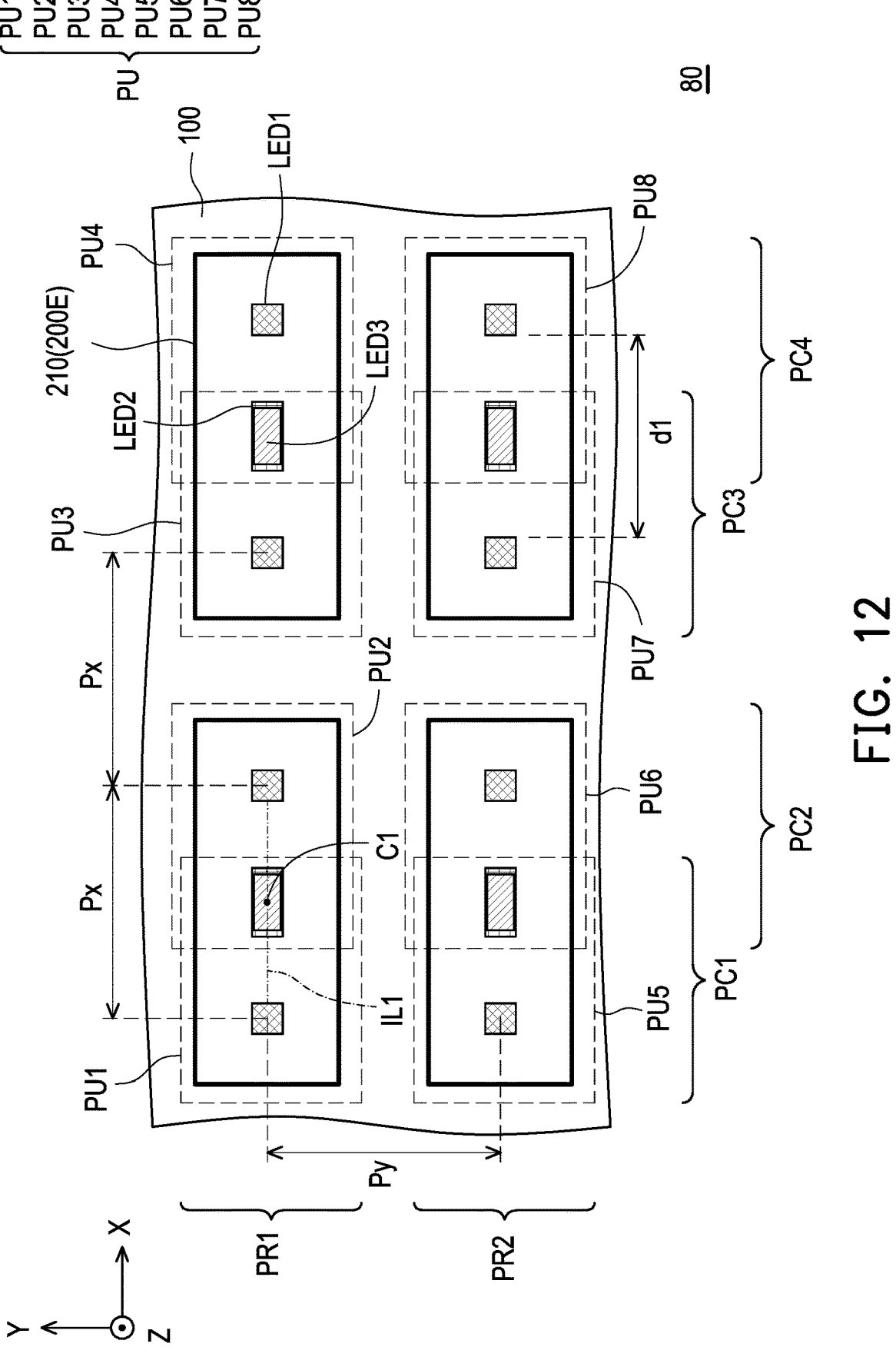
FIG. 12 is a schematic top view of a display apparatus according to an eighth embodiment of the disclosure.
Figure 13:
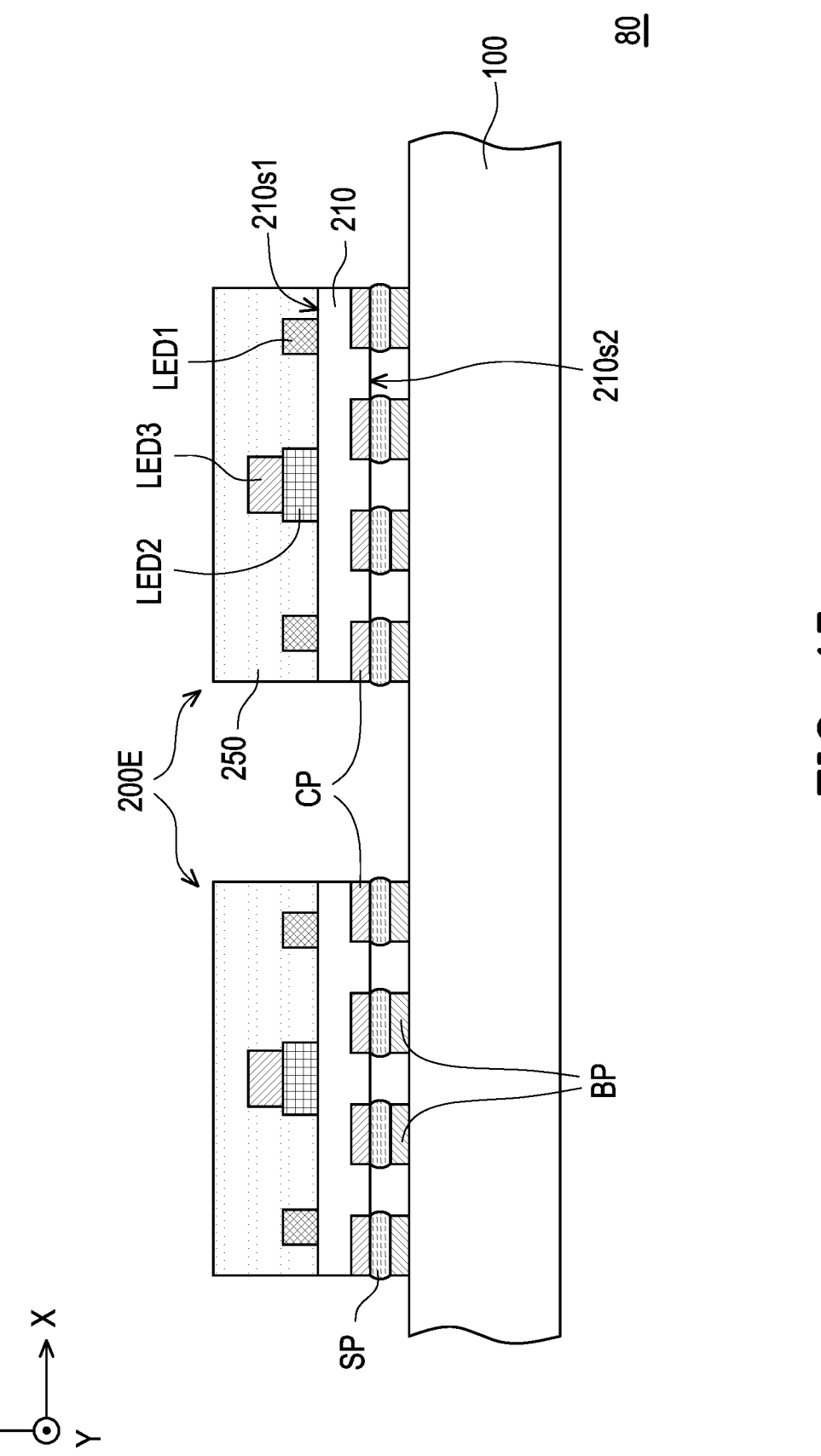
FIG. 13 is a schematic side view of the display apparatus of FIG. 12.

FIG. 12 is a schematic top view of a display apparatus according to an eighth embodiment of the disclosure. FIG. 13 is a schematic side view of the display apparatus of FIG. 12. With reference to FIG. 12 and FIG. 13, the difference between a display apparatus 80 of this embodiment and the display apparatus 10 of FIG. 1 lies in the disposing of the light-emitting device LED2 and the light-emitting device LED3 shared by two pixel units PU. In a package structure 200E of the display apparatus 80, the light-emitting device LED2 and the light-emitting device LED3 shared by two pixel units PU may overlap along a direction (e.g., the direction Z) perpendicular to the carrier 100. In other words, in this embodiment, it is possible that the shared light-emitting device LED2 and shared the light-emitting device LED3 on the same package structure 200E do not have the distance d2 as shown in FIG. 1.

For example, the shared light-emitting device LED2 and the shared light-emitting device LED3 may be stacked on the geometric center C1 of the virtual connecting line IL1 between the two light-emitting devices LED1 on the same package structure 200E, but not limited thereto. In this embodiment, the light-emitting device LED2 and the light-emitting device LED3 disposed overlapping each other may be electrically connected to the circuit substrate 210 respectively through different conductive structures (not shown). To be specific, in this embodiment, an orthogonal projection area of the light-emitting device LED2 on the circuit substrate 210 may be greater than an orthogonal projection area of the light-emitting device LED3 on the circuit substrate 210, but not limited thereto. In other embodiments, the respective orthogonal projection areas of the light-emitting device LED2 and the light-emitting device LED3 on the circuit substrate 210 may also be substantially the same and completely overlap each other. Therefore, the light-emitting device LED3 located on the light-emitting device LED2 may have a specific transmittance to the light emitted by the light-emitting device LED2 to reduce the loss of light emitted by the light-emitting device LED2. That is, at least part of lights emitted by the light-emitting device LED2 may pass through the light-emitting device LED3.

In summary of the foregoing, in the display apparatus according to the embodiments of the disclosure, in the four pixel units arranged successively, the first pixel unit and the second pixel unit share one second light-emitting device and one third light-emitting device, the third pixel unit and the fourth pixel unit share another one second light-emitting device and another one third light-emitting device, and the second light-emitting devices and the third light-emitting devices are not disposed between the second pixel unit and the third pixel unit. Accordingly, the number of light-emitting devices used can be reduced, and the arrangement distance between pixel units can also be reduced, which helps to improve the display quality.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus comprising:
a carrier; and
a plurality of pixel units disposed on the carrier, each of the pixel units having a first light-emitting device, wherein the pixel units are provided with a plurality of second light-emitting devices and a plurality of third light-emitting devices, and comprise a first pixel unit, a second pixel unit, a third pixel unit, and a fourth pixel unit sequentially arranged along a first direction,
wherein the first pixel unit and the second pixel unit being adjacent to each other share one of the second light-emitting devices and one of the third light-emitting devices, the third pixel unit and the fourth pixel unit being adjacent to each other share another one of the second light-emitting devices and another one of the third light-emitting devices, the second light-emitting devices and the third light-emitting devices are not disposed between the two first light-emitting devices of the second pixel unit and the third pixel unit being adjacent to each other,
wherein an orthogonal projection area of the first light-emitting device on the carrier is less than or equal to an orthogonal projection area of each of the second light-emitting devices on the carrier or an orthogonal projection area of each of the third light-emitting devices on the carrier.

2. The display apparatus according to claim 1, further comprising:
a plurality of circuit substrates disposed between the pixel units and the carrier, wherein the pixel units are disposed on the circuit substrates, and each of the circuit substrates is electrically connected to the carrier and some of the pixel units.

3. The display apparatus according to claim 2, wherein the circuit substrates comprise a first circuit substrate and a second circuit substrate, the first pixel unit and the second pixel unit are disposed on the first circuit substrate, and the third pixel unit and the fourth pixel unit are disposed on the second circuit substrate.

4. The display apparatus according to claim 3, wherein a first pitch between the first light-emitting device of the first pixel unit and the first light-emitting device of the second pixel unit along the first direction is different from a second pitch between the first light-emitting device of the second pixel unit and the first light-emitting device of the third pixel unit along the first direction.

5. The display apparatus according to claim 2, wherein each of the circuit substrates has a first surface and a second surface facing away from each other, the first surface facing the carrier is provided with a plurality of conductive pads, a part of the pixel units disposed on the first surface are electrically connected to a part of the conductive pads, and another part of the conductive pads disposed on the first surface are electrically insulated from the pixel units.

6. The display apparatus according to claim 1, further comprising:
a circuit substrate disposed between the pixel units and the carrier and electrically connected to the carrier and the pixel units, wherein a surface of the circuit substrate facing away from the carrier is provided with the pixel units.

7. The display apparatus according to claim 1, wherein the first light-emitting device of the first pixel unit and the first light-emitting device of the second pixel unit are arranged along the first direction and have a first distance, the one of the second light-emitting devices and the one of the third light-emitting devices disposed between the two first light-emitting devices of the first pixel unit and the second pixel unit are arranged along a second direction and have a second distance, and the first distance is greater than the second distance.

8. The display apparatus according to claim 7, wherein a geometric center of a first virtual connecting line connecting the first light-emitting device of the first pixel unit and the first light-emitting device of the second pixel unit coincides with a geometric center of a second virtual connecting line connecting the one of the second light-emitting devices and the one of the third light-emitting devices, and the first virtual connecting line is perpendicular to the second virtual connecting line.

9. The display apparatus according to claim 1, wherein a color of light emitted by the first light-emitting device is green, a color of light emitted by each of the second light-emitting devices is one of blue and red, and a color of light emitted by each of the third light-emitting devices is the other one of blue and red.

10. The display apparatus according to claim 1, wherein the first light-emitting device, each of the second light-emitting devices, and each of the third light-emitting devices are a flip-chip type light-emitting device or a lateral type light-emitting device.

11. The display apparatus according to claim 1, wherein the one of the second light-emitting devices and the one of the third light-emitting devices are disposed between the two first light-emitting devices of the first pixel unit and the second pixel unit being adjacent to each other, and the another one of the second light-emitting devices and the another one of the third light-emitting devices are disposed between the two first light-emitting devices of the third pixel unit and the fourth pixel unit being adjacent to each other.

12. The display apparatus according to claim 1, wherein the first light-emitting device of the first pixel unit, the one of the second light-emitting devices, and the one of the third light-emitting devices are arranged along a second direction, the first light-emitting device of the third pixel unit, the another one of the second light-emitting devices, and the another one of the third light-emitting devices are arranged along the second direction, and the second direction intersects the first direction.

13. The display apparatus according to claim 12, wherein the pixel units further comprise a fifth pixel unit and a sixth pixel unit adjacently arranged along the first direction, the first pixel unit and the fifth pixel unit are arranged along the second direction, the second pixel unit and the sixth pixel unit are arranged along the second direction, the fifth pixel unit and the sixth pixel unit share still another one of the second light-emitting devices and still another one of the third light-emitting devices, and the first light-emitting device of the sixth pixel unit, the still another one of the second light-emitting devices, and the still another one of the third light-emitting devices are arranged along the second direction.

14. The display apparatus according to claim 1, wherein the first light-emitting device of the second pixel unit, the one of the second light-emitting devices, and the one of the third light-emitting devices are arranged along a second direction, the first light-emitting device of the fourth pixel unit, the another one of the second light-emitting devices, and the another one of the third light-emitting devices are arranged along the second direction, and the second direction intersects the first direction.

15. The display apparatus according to claim 1, wherein the another one of the second light-emitting devices and the another one of the third light-emitting devices overlap along a direction perpendicular to the carrier.

16. The display apparatus according to claim 15, wherein the another one of the second light-emitting devices is located between the another one of the third light-emitting devices and the carrier, and an orthogonal projection area of the another one of the second light-emitting devices is greater than an orthogonal projection area of the another one of the third light-emitting devices.

17. The display apparatus according to claim 16, wherein at least part of lights emitted by the another one of the second light-emitting devices passes through the another one of the third light-emitting devices.

18. The display apparatus according to claim 1, wherein the first light-emitting devices, the second light-emitting devices and the third light-emitting devices are flip-chip type light-emitting devices, vertical type light-emitting devices, or lateral type light-emitting devices.

19. The display apparatus according to claim 1, wherein one of the first light-emitting device, the one of the second light-emitting devices and the one of the third light-emitting devices of the first pixel unit is one of a flip-chip type light-emitting device, a vertical type light-emitting device, and a lateral type light-emitting device, and another one of the first light-emitting device, the one of the second light-emitting devices and the one of the third light-emitting devices of the first pixel unit is another one of the flip-chip type light-emitting device, the vertical type light-emitting device, and the lateral type light-emitting device.

* * * * *